United States Patent [19]

Hodges et al.

[11] Patent Number: 5,286,672

[45] Date of Patent: Feb. 15, 1994

[54] METHOD FOR FORMING FIELD OXIDE REGIONS

[75] Inventors: Robert L. Hodges, Euless; Fu-Tai Liou, Carrollton, both of Tex.

[73] Assignee: SGS-Thomson Microelectronics, Inc., Carrollton, Tex.

[21] Appl. No.: 848,919

[22] Filed: Mar. 10, 1992

Related U.S. Application Data

[63] Continuation-in-part of Ser. No. 722,859, Jun. 28, 1991, abandoned.

[51] Int. Cl.$^5$ .............................................. H01L 21/76
[52] U.S. Cl. .................................... 437/70; 437/968
[58] Field of Search .............................. 437/67, 70; 148/DIG. 50, DIG. 85, DIG. 86

[56] References Cited

U.S. PATENT DOCUMENTS 4,637,128  1/1987  Mizatani ............................. 437/70

FOREIGN PATENT DOCUMENTS 0369842  5/1990  European Pat. Off. .
0405850  1/1991  European Pat. Off. .
0436475  7/1991  European Pat. Off. .
0471381  2/1992  European Pat. Off. .
58-40839  3/1983  Japan .

OTHER PUBLICATIONS

Han, Yu-Pin, et al, "Isolation Process ... MOS/VLSI", ECS Extended Abstracts 841 (1984) Abstract 67 p. 90.

*Primary Examiner*—George Fourson
*Attorney, Agent, or Firm*—Kenneth C. Hill; Lisa K. Jorgenson; Richard K. Robinson

[57] ABSTRACT

A method for forming field oxide regions which results in reduced diffusion of the channel stop implant into the active regions of the substrate. According to the present invention, an opening is formed through an oxidation barrier to define the field oxide regions. A dielectric layer is then deposited over the device, followed by implantation of a channel stop region. With the dielectric layer in place, the field oxide region is formed. During formation of the field oxide, the channel stop region will not diffuse into the active regions in the substrate. The thickness and conformality of the dielectric layer will affect the distance that the channel stop implant resides from the edges of the field oxide region.

4 Claims, 2 Drawing Sheets

METHOD FOR FORMING FIELD OXIDE REGIONS

CROSS REFERENCE TO RELATED APPLICATIONS

This application is a continuation-in-part of 07/722,859, filed Jun. 28, 1991, now abandoned, Louis Hodges and Fu-Tai Liou, entitled METHOD FOR FORMING FILED OXIDE REGIONS.

BACKGROUND OF THE INVENTION

1. Field of the Invention

The present invention relates generally to semiconductor integrated circuits, and more specifically to the implantation of channel-stop regions used in the oxidation process of field oxide.

2. Description of the Prior Art

In fabricating semiconductor circuits, the integrity of various structures on the circuit is of great importance. Undesirable impurities in the wrong portions of a circuit can adversely affect its function.

One type of structure commonly found on a semiconductor integrated circuit is a transistor. Field effect transistors can be either n-channel or p-channel, and both types of transistors can be formed on one integrated circuit. Field oxide regions are formed to separate the transistors. In this process regions of silicon dioxide are selectively grown on the substrate to provide isolation between dopant wells. As known in the art, transistors will be defined in regions without field oxide. These regions are known as active regions.

The process of growing the field oxide involves depositing and patterning insulating layers which protect the active region from oxidation. In one technique, an oxide layer is grown over the substrate, followed by depositing a polycrystalline silicon layer over the device. A layer of silicon nitride is then deposited over the polycrystalline silicon layer. Using a photoresist mask, an anisotropic etch is performed to create an opening through the insulating layers to expose a portion of the substrate.

The exposed portion of the substrate is implanted with a channel-stop region. The purpose of the channel-stop is to prevent latchup caused by turning on parasitic bipolar transistors. Following implantation of the channel-stop field oxide is grown on the exposed portion of the substrate.

As known in the art, oxidation of the substrate is performed using high temperatures. The high temperature causes the channel-stop implant to diffuse both laterally and vertically into the substrate. Migration of the channel-stop implant into an active region can cause the transistor or the integrated circuit to be defective. Those skilled in the art will recognize that the defects are the result of edge effects, which can include a shift in the threshold voltage.

It would be desirable to provide a method for reducing the diffusion of the channel-stop region during formation of field oxide in integrated circuit.

SUMMARY OF THE INVENTION

A method is provided for forming field oxide regions which results in reduced diffusion of the channel stop implant into the active regions of the substrate. According to the present invention, an opening is formed through an oxidation barrier to define the field oxide regions. A dielectric layer is then deposited over the device, followed by implantation of a channel stop region. With the dielectric layer in place, the field oxide region is formed. During formation of the field oxide, the channel stop region will not diffuse into the active regions in the substrate. The thickness and conformality of the dielectric layer will affect the distance that the channel stop implant resides from the edges of the field oxide region.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

DESCRIPTION OF THE PREFERRED EMBODIMENT

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit during fabrication are not drawn to scale, but instead are drawn so as to illustrate the important features of the invention.

Figure 1:
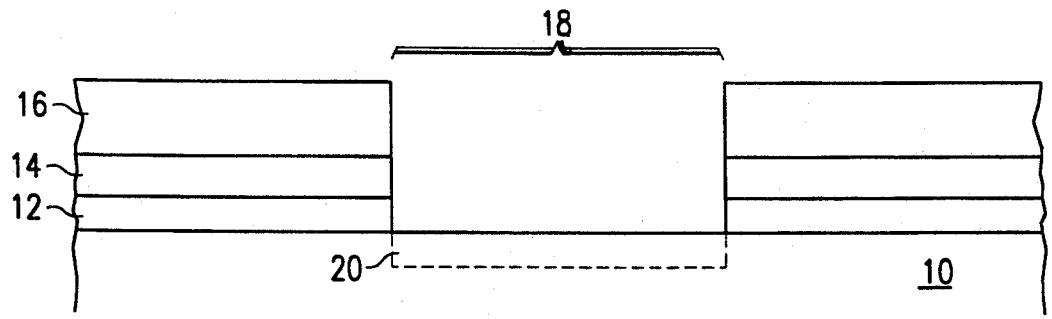
FIGS. 1 and 2 illustrate the method for forming field oxide in integrated circuits according to a prior art technique.

Referring to FIG. 1, an integrated circuit will be formed in and on a substrate 10. A thin dielectric layer 12 is deposited or grown on the surface of the substrate 10. This dielectric layer 12 typically is made of oxide. A conformal layer 14, of polycrystalline silicon, is deposited on the integrated circuit, followed by an insulating layer 16. The insulating layer 16 is also conformal to its underlying structures, and is typically made of silicon nitride.

Using a photoresist layer (not shown) as a mask, an opening 18 is formed by anisotropically etching through the Various layers to expose a portion of a substrate 10. Dopants are then implanted into the exposed portion of the substrate 10, creating a channel-stop region 20. The insulating layer 16, and its underlying layers, act as a mask for implantation of the dopants.

Figure 2:
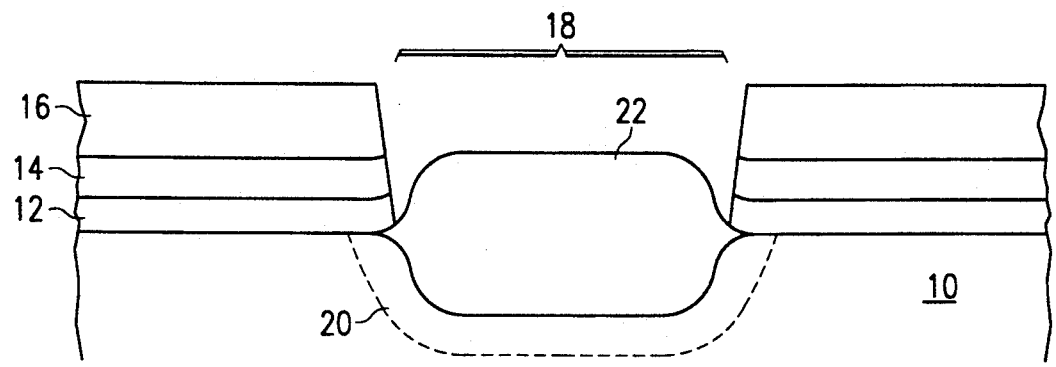

FIG. 2 illustrates the integrated circuit after an oxidation step has been performed to grow a layer of silicon dioxide 22. This layer of silicon dioxide 22 is known in the art as field oxide. As shown in FIG. 2, the channel-stop region 20 has diffused farther into the substrate 10 ahead of the growth of the oxide region 22. The diffusion of the channel-stop region 20 is caused by the high temperatures used during oxidation of the substrate 10. The diffusion of the channel-stop region 20 into the substrate 10 causes it to project beyond the field oxide 22 into the areas in which transistors will be formed.

Figure 3:
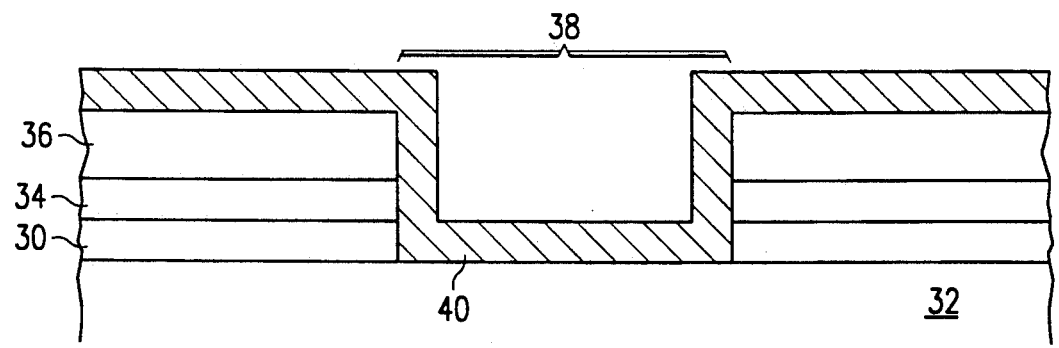
FIGS. 3, 4, 5, 6, 7 and s illustrate a preferred method of forming field oxide for integrated circuits according to the present invention.

Referring to FIG. 3, a preferred embodiment of a method for forming field oxide regions is shown. A dielectric layer 30 is deposited or grown on a semiconductor substrate 32. Polycrystalline silicon layer 34 and nitride layer 36 are also deposited over the integrated circuit. Using a photoresist mask, an anisotropic etch is performed and an opening 38 is created to expose a portion of the substrate 32. A dielectric layer 40 is then deposited over the integrated circuit and extends into the opening 38. This dielectric layer 40 is preferably made of oxide or polycrystalline silicon.

Figure 4:
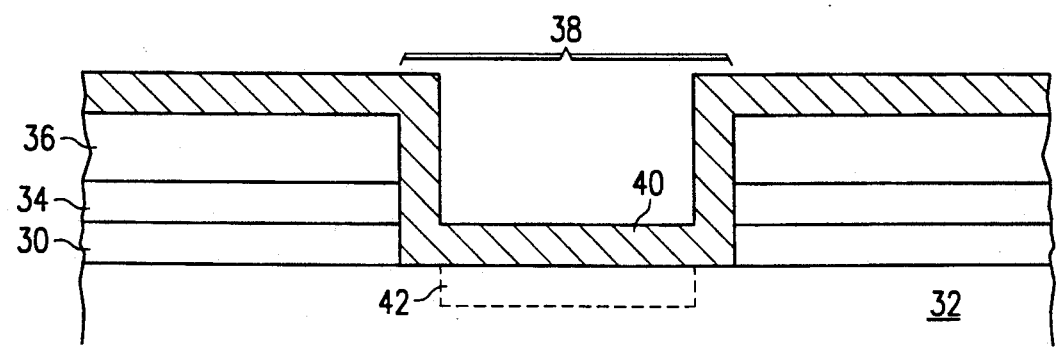

As shown in FIG. 4, implantation of the channel-stop region 42 can be performed with the dielectric layer 40 on the surface of the integrated circuit. This results in reducing the width of the channel-stop region 42. The distance the channel-stop implant 42 is located from the edges of the opening 38 is controlled by the thickness of the conformal dielectric layer 40.

Figure 5:
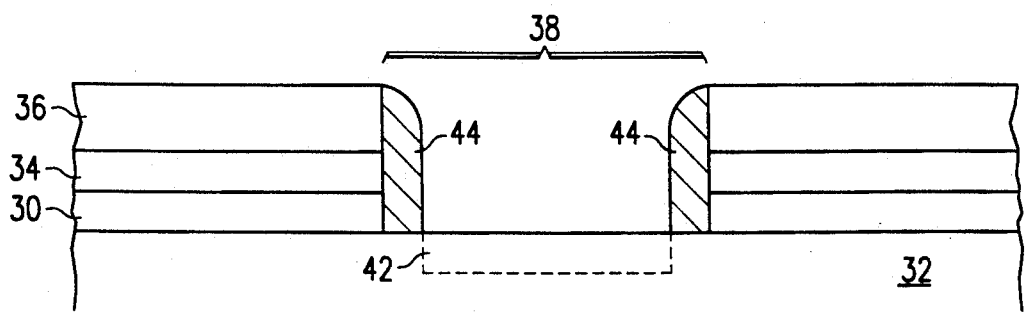

FIG. 5 illustrates an alternative approach for reducing the width of the channel-stop region 42. Before implanting the channel-stop region 42, an anisotropic etch is performed on the dielectric layer 40. This creates sidewall spacers 44 along the vertical sidewalls of the opening 38. During implantation of the channel-stop region 42, the sidewall spacers 44 will cause the width of the channel-stop region 42 to be reduced. The distance that the channel-stop region 42 resides from the edges of the opening 38 is controlled by the thickness of the sidewall spacers 44. One advantage to this approach is that lower implant energies may be used to implant the channel-stop regions 42 because the region is not being implanted through the dielectric layer 40.

Figure 6:
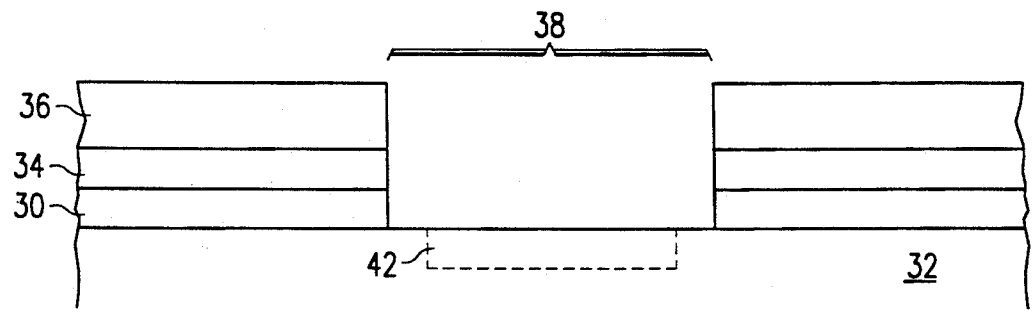

Referring to FIG. 6, a chemical isotropic etch is performed to remove the dielectric layer 40. If the alternative etchback technique of FIG. 5 is used, the etch will remove the sidewall spacers 44. The integrated circuit is now ready for oxidation to form field oxide.

Figure 7:
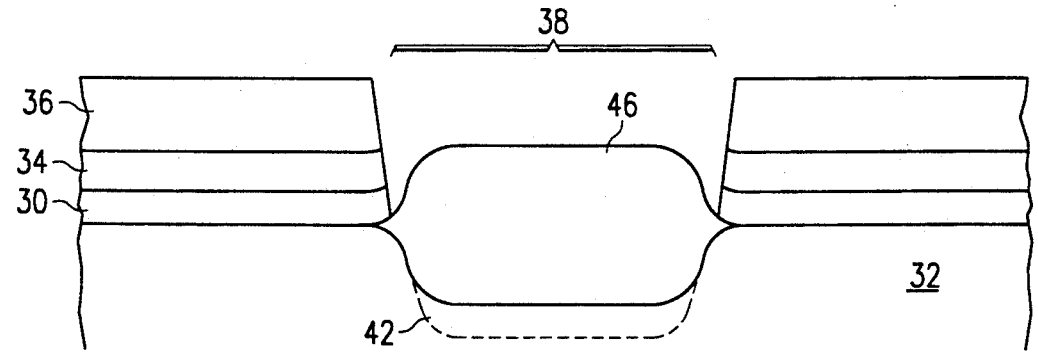

FIG. 7 illustrates the integrated circuit after a field oxide region 46 is grown on the substrate 32. As shown in FIG. 7, the channel-stop region 42 is not diffused into the regions of the substrate 32 adjacent to the field oxide 46. The integrated circuit is now ready for further processing using techniques which are known in the art.

Figure 8:
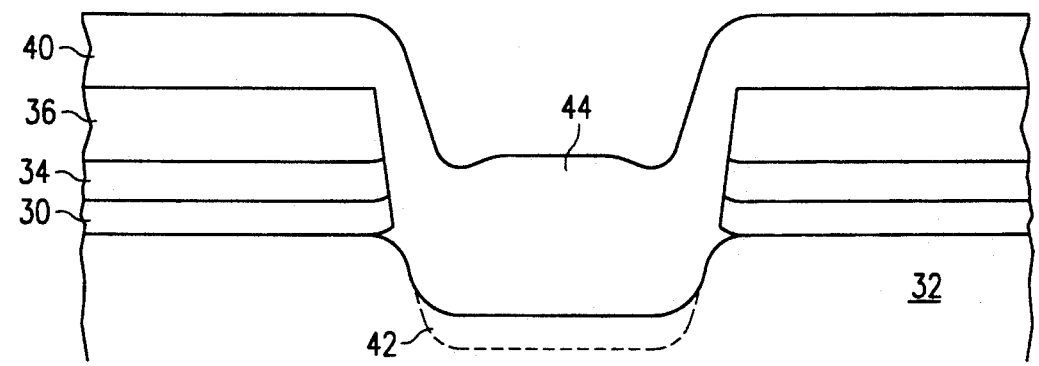

Referring to FIG. 8, another alternative approach for reducing the width of the channel stop region 42 is depicted. After performing the steps described with reference to FIG. 4, a field oxide region 46 is formed in the substrate 32. Because the dielectric layer 40 remains on the device during formation of the field oxide region 46, the dielectric layer 40 oxidizes also and forms a thicker oxide layer or a polyoxide layer. During formation of the field oxide region 46, the channel stop implant 42 does not diffuse into the active areas in the substrate 32. The distance the channel stop implant 42 is located from the edges of the opening 38 is controlled by the thickness and conformality of the dielectric layer 40. As known in the art, this method requires a longer deglaze process to ensure the oxidized dielectric layer 40 is removed prior to removal of the nitride layer 36, polycrystalline silicon layer 34, and dielectric layer 30.

As will be appreciated by those skilled in the art, the techniques described above prevent the channel-stop region from diffusing into the regions used to form transistors. This minimizes edge effects which occur along a channel region adjacent the field oxide. As device geometries shrink, such edge effects become increasingly troublesome, and minimizing them as described can dramatically improve the operating parameters of the integrated circuit device.

While the invention has been particularly shown and described with reference to a preferred embodiment, it will be understood by those skilled in the art that various changes in form and detail may be made therein without departing from the spirit and scope of the invention.

What is claimed is:

1. A method for formation of an isolation region in an integration circuit, comprising the steps of:
   creating an oxidation barrier over a semiconductor substrate;
   patterning and etching the oxidation barrier to define an opening where oxide will be grown;
   forming a conformal layer of polycrystalline silicon over the oxidation barrier and extending into the opening;
   implanting a channel stop region through the conformal layer of polycrystalline silicon into the semiconductor substrate; and
   oxidizing a field oxide region in the substrate while the conformal layer of polycrystalline silicon remains in place.

2. The method of claim 1, wherein said step of creating the oxidation barrier comprises depositing a layer of silicon nitride over the semiconductor substrate.

3. The method of claim 1, wherein said step of creating the oxidation barrier comprises the steps of:
   forming a layer of oxide over the semiconductor substrate;
   depositing a layer of polycrystalline silicon over the layer of oxide; and
   depositing a layer of silicon nitride over the polycrystalline silicon layer.

4. The method of claim 1, wherein the thickness of said conformal layer of polycrystalline silicon determines a distance that the channel stop region is located from the edges of the opening during the implantation of the channel stop region.

* * * * *